United States Patent

Chiba

[15] 3,671,818

[45] June 20, 1972

[54] SEMICONDUCTIVE CERAMIC CAPACITOR

[72] Inventor: Minoru Chiba, Kyoto, Japan

[73] Assignee: Nichicon Capacitor Ltd., Kyoto, Japan

[22] Filed: July 27, 1970

[21] Appl. No.: 64,886

Related U.S. Application Data

[62] Division of Ser. No. 807,734, March 17, 1969, Pat. No. 3,570,113.

[52] U.S. Cl. ................................317/230, 317/258, 317/238
[51] Int. Cl. ..........................................................H01l 7/06
[58] Field of Search...................317/230, 231, 238, 258, 261

[56] References Cited

UNITED STATES PATENTS 3,419,758 12/1968 Hayakawa et al......................317/230
3,426,249 2/1969 Smyth....................................317/230
3,529,218 9/1970 Nitta et al.............................317/238

*Primary Examiner*—James D. Kallam
*Attorney*—Eugene Geoffrey, Jr.

[57] ABSTRACT

A semiconductor ceramic capacitor having a thin layer containing copper on at least one surface portion of a substrate formed of N-type barium titanate containing a small quantity of a rare earth element and a coating containing frit, lead, and powdered silver or silver oxide with the lead, silver and copper being diffused into said substrate and a conductive layer on another surface portion of said substrate to form said capacitor. The invention further provides a method of manufacturing the foregoing capacitor which is made by applying said copper layer and said layer containing frit, lead, and silver in overlying relationship and heating said substrate and layers in an oxidizing atmosphere.

3 Claims, 6 Drawing Figures

PATENTED JUN 20 1972

3,671,818

Figure 1A:
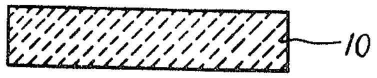

INVENTOR.
MINORU CHIBA
BY [signature]
ATTORNEY

SEMICONDUCTIVE CERAMIC CAPACITOR

This is a division of application Ser. No. 807,734, filed Mar. 17, 1969, now U.S. Pat. 3,570,113.

This invention relates to ceramic capacitors and more specifically to a novel and improved capacitor utilizing barium titanate as a semiconductor substrate and conductive layers on at least two surface portions of the substrate with at least one of the conductive layers being formed to provide relatively high insulation resistance and at the same time affording a relatively high electrostatic capacitance. The invention further concerns an improved method of making a semiconductor capacitor.

Barium titanate having a rare earth element to control the valency thereof forms an N-type semiconductor, and it is known that when such a semiconductor is placed in contact with properly chosen metals, positive and negative charge distributions are produced on the contacting faces with the result that a semiconductor capacitor is formed. Known capacitors utilizing semiconductor substrates and metal layers in contact with the substrate have the advantage of providing capacitances as large as 0.5 mfd per $cm^2$. The difficulty with such capacitors, however, is that the insulation resistance is as small as a few thousand ohms per $cm^2$ with the result that the usefulness of the device is relatively limited.

Ceramic capacitors have also been fabricated by applying a thin film of an element such as sodium or aluminum to surface portions of the substrate to compensate for the change in valency of the substrate and return it to its original state. Such thin films may be evaporated or plated on the surface portions of the substrate, and the substrate together with the thin films are heated to about 700° to 1,300° C. In so doing, a barium titanate dielectric film is formed on the surface of the semiconductor. Capacitors formed in this manner however while having insulation resistances as high as 10 megohms per $cm^2$, the electrostatic capacitances are only of the order of 0.05 mfd or less per $cm^2$. Accordingly, compact capacitors having large capacitance cannot be obtained.

This invention overcomes the difficulties encountered with prior semiconductor capacitors and provides an improved capacitor and method of making it which affords both relatively large electrostatic capacitance and insulation resistance and at the same time avoids the need for thermal treatment at temperatures as high as 1,300° C.

Another object of the invention resides in the provision of a compact semiconductor ceramic capacitor having relatively high insulation resistance and at the same time affords relatively high capacitance.

The above and other objects and advantages of the invention will become more apparent from the following description and accompanying drawings forming part of this application.

Figure 1B:
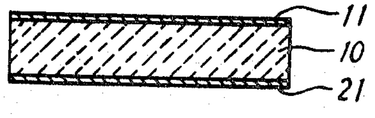
Figure 1C:
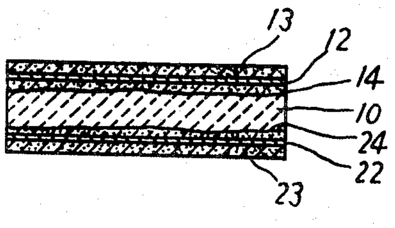
Figure 1D:
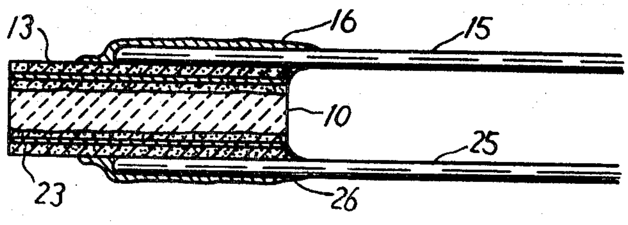
Figure 1E:
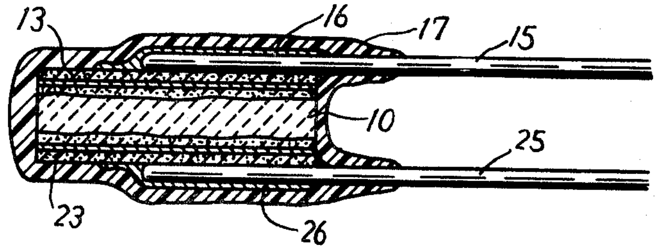
Figure 2:
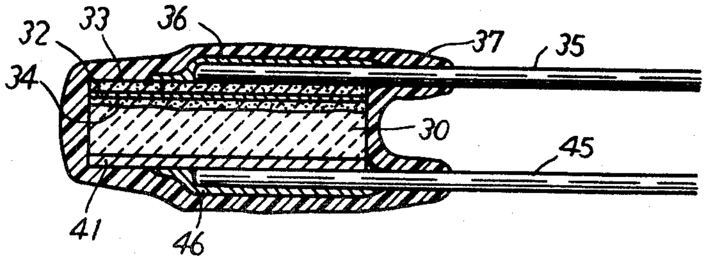

In the drawings:

FIGS. 1*a* through 1*e* are cross-sectional views showing successive steps in the formation of one embodiment of a capacitor in accordance with the invention; and FIG. 2 is a cross-sectional view of a modified embodiment of the capacitor in accordance with the invention.

The capacitor in accordance with the invention is preferably provided with a substrate formed of a barium titanate semiconductor preferably having two major opposing surfaces. Thin layers of copper are applied to both of said major surfaces and a paint-like material consisting of a mixture of metallic silver powder or silver oxide and 10 to 20 percent by weight of a frit consisting principally of lead glass, a natural or synthetic resin or an organic binder of cellulose group and a solvent is coated on the copper layers. The structure is then subjected to temperatures in the range of 500° to 800° C. to form two metal silver electrodes. The resultant capacitor will have a electrostatic capacitance of the order of 0.05 to 0.7 mfd per $cm^2$ and an insulation resistance of $10^5$ to $10^8$ ohms per $cm^2$.

Lead wires may be attached to the capacitor in any suitable manner in order to provide a conductive connection to the silver electrodes. Although the foregoing example provides metal silver electrodes on both of the major surfaces of the semiconductor body, one of the surfaces may be provided with a metal electrode in ohmic contact therewith. Furthermore, the semiconductor body may either be in the form of a rectangular plate or may be cylindrical in configuration.

In the formation of the layer containing the frit and silver, if the quantity of frit is 10 percent or less, the insulation resistance decreases materially, and if the quantity of frit exceeds 30 percent, the capacitance decreases because the frit layer becomes thicker than necessary. It is therefore preferable that the frit contain as much lead as possible and the quantity of lead should preferably be at least 40 percent by weight. If the quantity of the lead is less than 40 percent, sufficient diffusion of lead into the copper and barium titanate becomes difficult.

The ceramic capacitor in accordance with the invention affords two features, namely, a large capacitance at the interface or barrier between the semiconductor and the metal layer and a high insulation resistance of the thin dielectric layer on the semiconductor surface. The thin copper oxide layer interposed between the barium titanate and the metal silver electrode and the thin frit layer consisting principally of lead contribute to the increase of electrostatic capacitance and relatively high insulation resistance respectively. The improved semiconductor ceramic capacitor in accordance with the invention cannot be obtained by merely providing overlying layers of copper oxide and frit containing metal silver applied to the surface of the barium titanate. The advantages of the invention are attained by forming the thin copper layer on the surface of the barium titanate by evaporation or plating, applying a layer of silver or silver oxide containing 10 to 30 percent by weight of a frit consisting mainly of lead glass and then heating the structure at about 500° to 800° C. Under these conditions the copper is oxidized, the copper component is diffused into the barium titanate, the lead component is diffused into the copper and into the barium titanate and the silver component is diffused into the frit, the copper and the barium titanate. This action produces the relatively high capacitance and at the same time high resistance since the dielectric layer and the insulating layer are both interposed between the barium titanate and the metal silver electrode. The thickness of the metal copper layer adhered to the barium titanate is preferably of the order of $1 \times 10^{-4}$mm to $50 \times 10^{-4}$mm, and good results are obtained when the adhered quantity of silver powder containing 10 to 30 percent in weight of frit which in turn consists of 5 mg to 30 mg per $cm^2$ of lead.

Referring to the drawings and more specifically to FIG. 1, FIG. 1*a* illustrates a body of N-type barium titanate semiconductor material which is in the form of a plate having upper and lower surfaces. The raw material used to form the plate 10 is finely divided barium titanate formed by conventional procedures from a mixture of a titanium compound and a barium compound which are thermally reacted and to which 0.4 mol percent of yttrium is added. The raw material is then formed into the desired contour and then heated for an hour at 1,300° C. in air. Its specific resistance is approximately 20 ohms per cm.

After the formation of the body 10, the upper and lower surfaces as shown in FIG. 1*b* are coated to form copper layers 11 and 21 each having a thickness of about $6.0 \times 10^{-4}$mm. The copper may be deposited by evaporation on each of the surfaces. After formation of the copper layers a paint-like material is applied over the copper layers 11 and 21 so that the quantity of adhered solid components is about 20 milligrams per $cm^2$. This coating comprises essentially 100 parts by weight of a mixed powder containing 20 parts by weight of a frit consisting principally of lead glass, 80 parts by weight of silver powder, 5 parts by weight of nitrocellulose binder and 3 parts by weight of an alkyd resin. These materials are mixed and dissolved in about 50 parts by weight of ethyl acetate. After the so-called frit coating is dried, the entire structure is heated for about an hour at about 600° C. in air and the resultant structure is as shown in FIG. 1*c*. It will be observed that the copper layers 11 and 21 are converted to copper oxide layers 12 and 22. At the same time conductive layers 12 and 23 are formed on the outer surface and layers 14 and 24 are formed by diffusion of the silver, copper and lead into the barium titanate.

Referring now to FIG. 1*d*, lead wires 15 and 25 are conductively bonded to the two surfaces by conductive bonding agents 16 and 26. It is not preferable to attach these lead wires by means of soldering because it tends to destroy the construction of the element as shown in FIG. 1*c*. A preferable bonding agent consists of a kneaded mixture formed of 20 percent by weight of a commercial normal temperature hardening epoxy resin and 80 parts by weight of silver powder.

After the electrodes are attached, an insulating coating is applied to the surface of the structure as shown in FIG. 1*e* to complete the capacitor. The insulating coating may be formed of any suitable material such as a phenol resin and the coating may be applied by dipping the capacitor into the resin and then drying the resin in air for about 5 hours at a temperature of the order of 150° C.

A test capacitor formed in accordance with the procedure described above has an electrostatic capacitance of approximately 0.5 mfd per $cm^2$, and the insulation resistance of $10^6$ ohms per $cm^2$. The tan $\gamma$ at 1 KC was approximately 5 percent.

A modified embodiment of the invention is illustrated in FIG. 2. In this figure the copper oxide layer 32, the conductive layer 33, and the diffusion layer 34 are formed by the method as described above. Note that these layers are applied to only one surface of the body 30. The other surface of the body 30 is merely provided with a silver layer which may be evaporated onto the surface. The lead wires 35 and 45 are then attached to the conductive layer 33 and the silver layer 41 by means of a conductive bonding agent 36 such as that described above, and the structure is then coated with insulating material 37 which may correspond to the insulating coating 12 of FIG. 1*e*.

The forms of the capacitor described above enable the production of a compact device having relatively large capacitance and high insulation resistance and at the same time can be fabricated easily and inexpensively.

What is claimed is:

1. A semiconductor ceramic capacitor comprising a substrate of N-type barium titanate having a small quantity of a rare earth element therein, a first layer formed on at least one surface portion of said substrate and containing copper, silver and lead diffused into said substrate and with the outer surface comprising silver and a conductive layer on another surface portion of said substrate.

2. A semiconductor ceramic capacitor according to claim 1 wherein lead wires are attached to said first and second layers by a low temperature conductive bonding agent.

3. A semiconductor ceramic capacitor according to claim 1 wherein said conductive layer on said other surface portion contains copper, silver and lead diffused into said substrate with the outer surface comprising silver.

* * * * *